(12) United States Patent
Minas

(10) Patent No.: US 6,456,074 B1
(45) Date of Patent: Sep. 24, 2002

(54) QUIET GRADIENT COIL

(75) Inventor: Constantinos Minas, Slingerlands, NY (US)

(73) Assignee: Intermagnetics General Corporation, Latham, NY (US)

( * ) Notice: Subject to any disclaimer, the term of this patent is extended or adjusted under 35 U.S.C. 154(b) by 0 days.

(21) Appl. No.: 09/493,868

(22) Filed: Jan. 28, 2000

(51) Int. Cl.[7] .................................................. G01V 3/00
(52) U.S. Cl. ........................ 324/318; 324/309; 324/322
(58) Field of Search ................................. 324/318, 309, 324/322

(56) References Cited

U.S. PATENT DOCUMENTS

| | | | |
|---|---|---|---|
| 4,639,672 A | 1/1987 | Beaumont | 324/318 |
| 4,652,824 A | 3/1987 | Oppelt | 324/318 |
| 4,755,754 A | 7/1988 | Sireul et al. | 324/318 |
| 4,954,781 A | 9/1990 | Hirata | 324/318 |
| 5,084,676 A | 1/1992 | Saho et al. | 324/318 |
| 5,189,372 A | 2/1993 | Igarashi et al. | 324/318 |
| 5,235,283 A | 8/1993 | Lehne et al. | 324/318 |
| 5,331,281 A | 7/1994 | Otsuka | 324/318 |
| 5,481,191 A | 1/1996 | Rzedzian | 324/318 |
| 5,489,848 A | 2/1996 | Furukawa | 324/318 |
| 5,559,435 A | 9/1996 | Harada | 324/318 |
| 5,572,131 A | 11/1996 | Rzedzian | 324/318 |
| 5,630,415 A | 5/1997 | Kaufman | 324/318 |
| 5,661,445 A | 8/1997 | Larson, III et al. | 324/318 |
| 5,698,980 A | 12/1997 | Sellers et al. | 324/318 |

OTHER PUBLICATIONS

Qiu et al , Vibration control of a cylindrical shell used in MRI equipment: Smart Mater Struct. 4 (1995) A75–A81.*

* cited by examiner

Primary Examiner—Edward Lefkowitz
Assistant Examiner—Brij B. Shrivastav
(74) Attorney, Agent, or Firm—Katten Muchin Zavis Rosenman

(57) ABSTRACT

A gradient coil assembly is directly coupled throughout its entire axial length and circumferential area to the inner cylinder of the cryostat vacuum container enclosing a cylindrical superconducting MRI static field magnet. Any air space between the concentric gradient coil assembly and the cryostat is eliminated. This stiffer system produces lower velocities of the switched gradient coil assembly, which in turn produces lower noise levels in the patient opening of the gradient coil assembly and in the ambient environment. Alternatively, an annular space separates the gradient coil assembly from the MRI static field magnet assembly, and the gradient coil assembly is rigidly coupled to the inner cylinder of the MRI static field magnet assembly by discrete coupling rings. The annular space or chamber between the two assemblies is broken into smaller volumes or subchambers, which do not interconnect in the axial direction and thereby prevent axial propagation of noise generated in the chambers. Acoustic treatment of the surfaces within the chambers, including evacuation of that space, can reduce the amount of noise escaping to the ambient environment.

18 Claims, 8 Drawing Sheets

QUIET GRADIENT COIL

BACKGROUND OF THE INVENTION

This invention relates generally to magnetic resonance imaging (MRI), and more particularly to an MRI system construction that reduces noise generation related to creation of magnetic gradients in a static magnetic field.

Noise generation has always been a significant problem in MRI apparatuses where living subjects are imaged in the bore of an MRI magnet. High frequency switching of the currents in the gradient coils used in magnetic resonance imaging applications produces alternating Lorentz forces. Applied at high frequencies, resultant vibrations of the gradient coil assembly and any vibrations transmitted to the MRI static field magnet, produce acoustic pressure levels which can be harmful to the unprotected ears of the patient and operator. For fast acquisition of magnetic resonant imaging such as echo-planar imaging (EPI), with rise times in a range of 250–2000 micro seconds, the sound pressure level (SPL) can exceed 130 dB.

Generally in MRI systems, a static magnet, which may be a superconducting device, creates a substantially homogeneous static magnetic field within a region to be imaged. A cylindrical patient opening that accepts a patient to be examined is surrounded by the superconducting magnet that generates the homogeneous magnetic field. In recent developments, static field magnets are plate-like generally flat devices that oppose each other across the patient opening. Electromagnetic gradient coils are positioned near the static magnet structure. When the gradient coils are energized in predetermined sequences, the static homogeneous field in the imaging area is momentarily altered to produce a controlled gradient magnetic field in a selected direction. Generally, three gradient coils control three orthogonal coordinate directions.

The gradient coils are cylindrical when the static magnet coils are cylindrical. The gradient coils are plate like when the static magnet is formed of parallel plates. During the MRI measurements, requisite gradient magnetic fields are created by currents that are rapidly applied and removed from these gradient coils, respectively. Rapidly switching current in the gradient coils creates alternating forces, as stated, in a continuous string of acoustical noise bursts within the patient opening. Acoustic frequency is directly related to the switching frequency of the gradient coil currents.

Whereas the diagnostic advantages of using MRI techniques far outweigh the unpleasantness related to intense levels of noise, a quieter MRI apparatus is greatly to be desired for use with living subjects, both patients and operators.

SUMMARY OF THE INVENTION

Generally speaking, in accordance with the invention, a quieter MRI apparatus is provided. The invention includes an integrated MRI gradient coil/MRI static field magnet assembly which produces significantly lower noise when the gradient coil is excited in a conventional manner. The assembly includes a gradient coil assembly that is directly coupled to the inner cylinder of the cryostat vacuum container enclosing a cylindrical superconducting. MRI static field magnet.

In one embodiment, the gradient coil assembly is directly coupled throughout its entire axial length and circumferential area to the container of the MRI static field magnet. This coupling eliminates any air space between the concentric gradient coil assembly and the static field magnet. Such an air space can act as a resonant acoustic volume producing very high levels of noise when the gradient coil assembly is excited. The source of noise is eliminated by elimination of this air space.

Further, the integrated gradient coil assembly/static field magnet system assembly is stiffer than a conventional system where the gradient coil assembly is attached to the main magnet only at its two extreme axial ends. A stiffer system produces lower velocities of the switched gradient coil, which in turn produces lower noise levels in the patient opening of the gradient coil assembly and in the ambient environment. Mathematical analysis indicated, and actual tests verify, that elimination of the air space and the acoustic resonance volume between the gradient coils and the static field magnet assembly produces a significantly quieter system. The construction is implemented by shrink fitting the inner cylinder of the outer vacuum container of the MRI static field magnet directly onto the gradient coil assembly.

In an alternative embodiment in accordance with the invention, an annular space separates the gradient coil assembly from the MRI static field magnet assembly, and the gradient coil assembly is rigidly coupled to the inner cylinder of the MRI static field magnet assembly by discrete coupling rings. The annular space or chamber between the two assemblies is broken into smaller volumes or subchambers, which do not interconnect in the axial direction and thereby prevent axial propagation of noise generated in the chambers. Acoustic treatment of the surfaces within the chambers, including evacuation of that space, can reduce the amount of noise escaping to the ambient environment.

Accordingly, it is an object of the present invention to provide an improved gradient coil mounting for an MRI apparatus that operates at reduced noise levels.

It is a further object of the invention to provide an improved gradient coil mounting construction that is stiffer than a conventional gradient coil mounting.

It is yet another object of the invention to provide an improved gradient coil mounting construction that generates noise at higher acoustic mode resonant frequencies than a conventional gradient coil mounting with the same excitation.

Still other objects and advantages of the invention will be apparent from the specification. The invention accordingly comprises the features of construction, combinations of elements, arrangements of parts which will be exemplified in the constructions hereinafter set forth, and the scope of the invention will be indicated in the claims.

BRIEF DESCRIPTION OF THE DRAWINGS

For a fuller understanding of the invention, references is had to the following description taken in connection with the accompanying drawings, in which.

DESCRIPTION OF PREFERRED EMBODIMENTS

Figure 1:
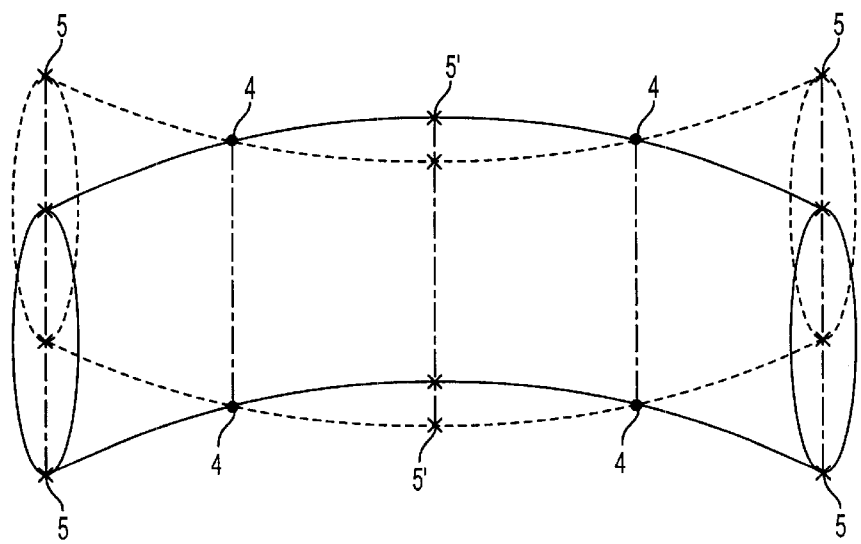
FIG. 1 illustrates bending action in a gradient coil assembly in a conventional MR apparatus.

FIG. 1 illustrates a generally accepted view of the reversed bending action that occurs in a conventional cylindrical gradient coil system as it vibrates under X or Y coil excitation. The maximum mechanical displacements occur at the ends 5 and center 5', with intermediate static nodes 4. Low frequency noise is high based upon the axial length of the assembly. To the contrary, in accordance with the present invention, a similar gradient coil is constrained at its ends and center, thereby greatly reducing the physical displacements and also shortening the wavelength of the vibrations to produce higher frequency sounds that are more easily attenuated by their surroundings.

Figure 2A:
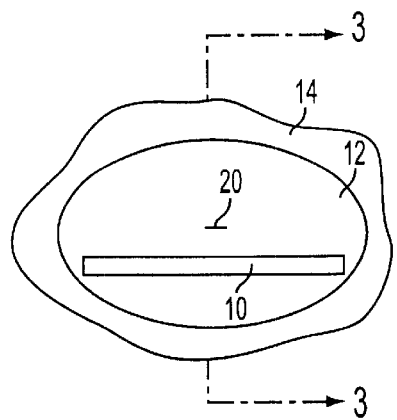
FIGS. 2a–c illustrate shapes of openings for receiving a patient in MR apparatuses wherein the present invention is suited.
Figure 2B:
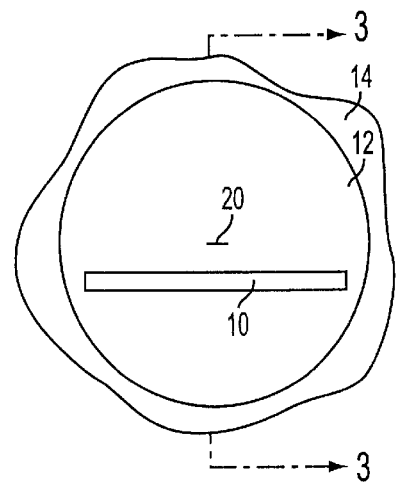
Figure 2C:
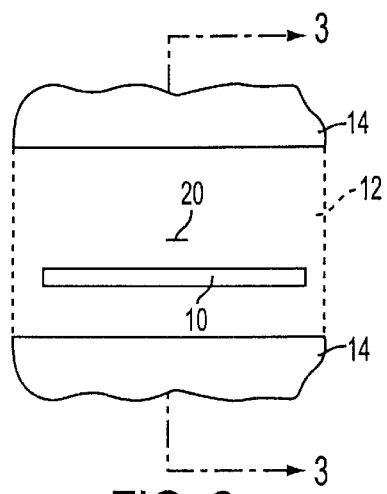

With respect to FIGS. 2a–c, a table 10 on which a patient lies is translatably located in a known manner within the opening 12 of an MRI apparatus 14. Generally, in most common use, are MRI apparatuses 14 having a circular opening 12 (FIG. 2b). In such apparatuses, the static field magnetic coils are cylindrical as are the gradient coils X, Y, Z.

An elliptical opening 12 (FIG. 2a) may provide smaller overall dimensions and permit use of a lower strength main magnet for the static field. The static and gradient field coils are appropriately shaped for efficient construction and operation with the elliptical opening.

In a construction as in FIG. 2c, the static magnet windings are in the form of flat plates, above and below the table 10, as are the gradient coils associated with each of the static magnets.

Configurations of MRI apparatuses are not limited to those illustrated in FIG. 2a–c. Many variants are now available to meet specific uses and other contours are possible in future applications. For example, in some MRI apparatuses a patient is seated on a chair in the patient opening. Nevertheless the principles of the present invention are applicable in all MRI apparatuses where gradient coils are associated with static magnetic field coils.

The table 10 is movable into and out of the cavity (patient opening) provided for the patient in the MRI apparatus, that is, in FIGS. 2a–c, the table moves in the directions in and out of the paper of that figure. Elevation of the table is also adjustable.

Figure 3:
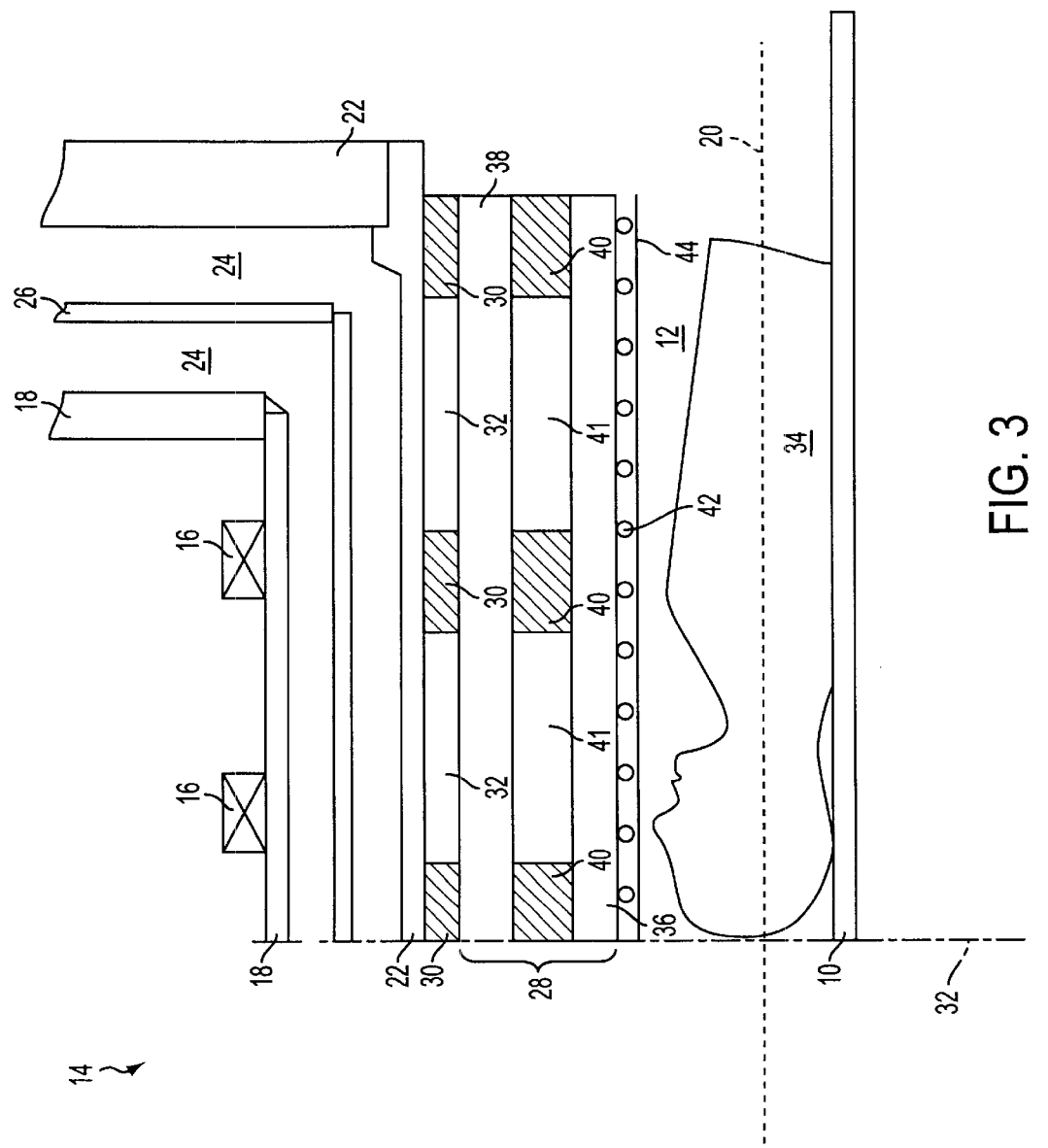
FIG. 3 is a partial cross-section of an MR apparatus in accordance with the invention taken along the line 3—3 in any of the MR apparatuses illustrated in FIG. 2.
Figure 4:
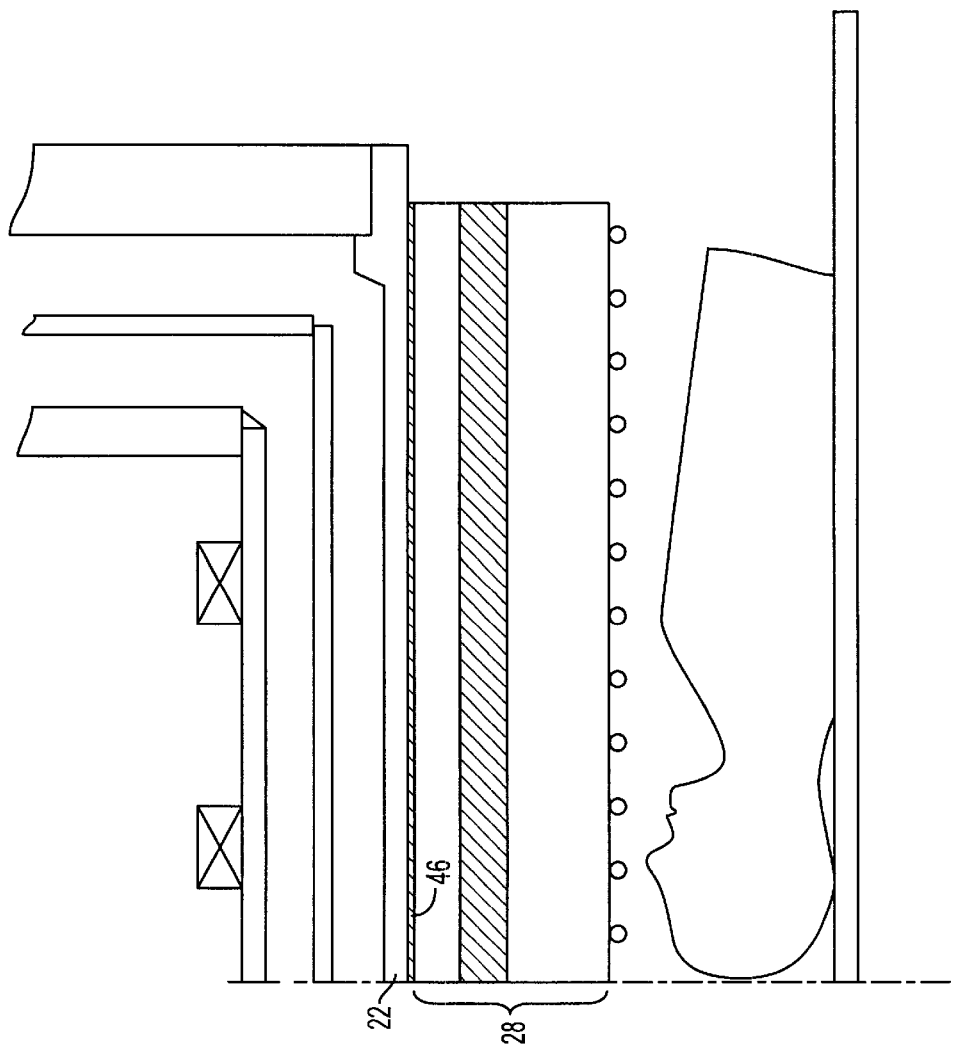
FIG. 4 is similar to FIG. 3 and is a second embodiment of a MR apparatus in accordance with the invention.
Figure 5:
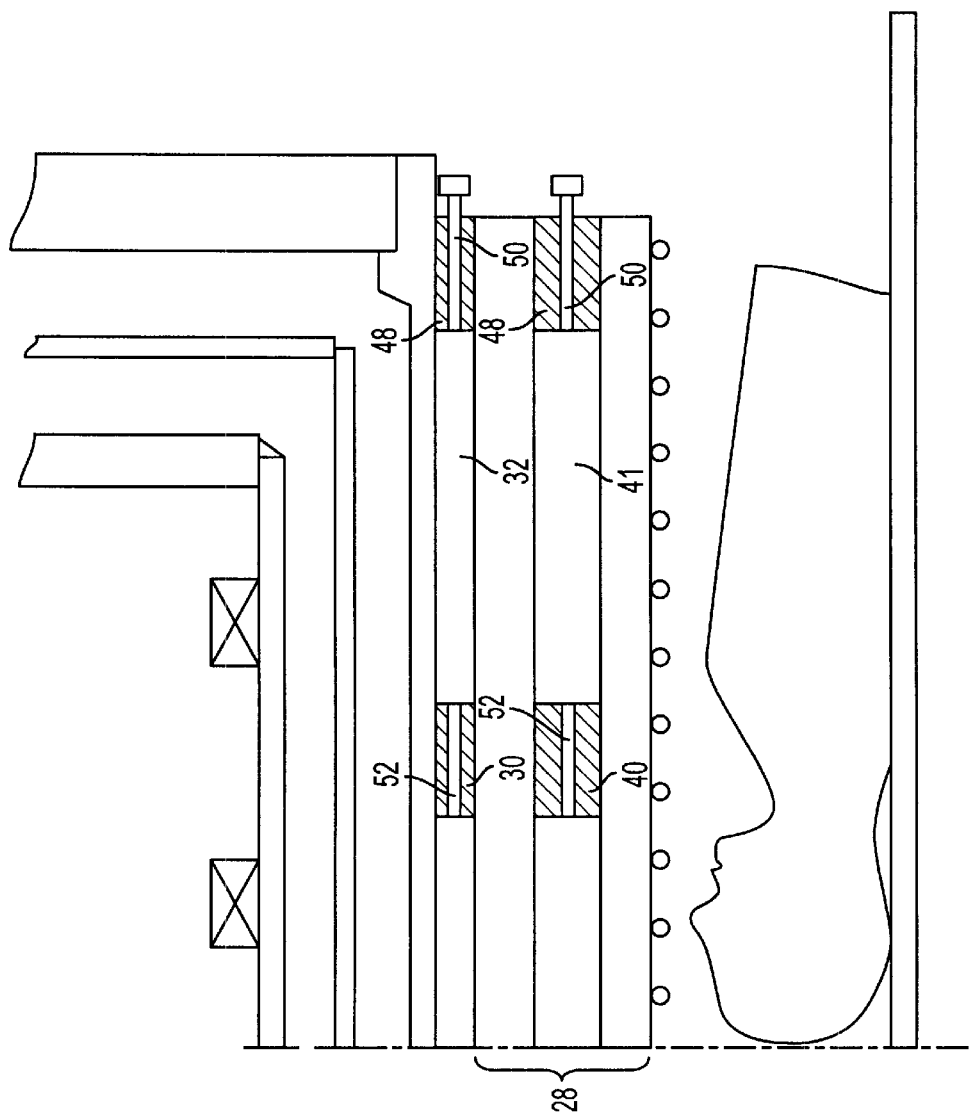
FIG. 5 is similar to FIG. 3 and is a third embodiment of a MR apparatus in accordance with the invention.

FIGS. 3–5 are cross-sections taken along the line 3—3 of FIGS. 2a–c. FIGS. 3–5 are schematic representations and are drawn to no scale. FIGS. 3–5 are applicable to cross-sections for each of FIGS. 2a–c, that is elliptic, circular and "flat plate" openings.

In FIG. 3, a static field main magnet coil 16 is submerged in liquid helium in a vessel 18, and is cylindrical about the center line 20 of the MR apparatus 14. The cryogenically cold helium vessel 18 is contained in a cryostat including an outer vessel 22. A high level insulating vacuum is maintained in the space 24 between the helium vessel 18 and the cryostat vessel 22. A thermal shield 26 within the vacuum space 24 reduces heat transfer to the outside ambient and improves the thermodynamic efficiency of the cryostat by reducing evaporation of liquid helium. Construction of the cryostat is conventional, is not a novel portion of the present invention, and is therefore not discussed in detail herein. Such construction is well known in the cryostat art.

A gradient field coil assembly 28 is positioned between the inner cylinder of the outer cryostat vessel 22 and the patient opening center line 20 and is separated from the vessel 22 by coupling rings 30 that fix the gradient coils assembly 28 relative to the cryostat 22 and main magnetic coils 16. Spaces 32 are present between the coupling rings 30. As is known to those skilled in the art, it is extremely important that the gradient coils in the assembly 28 have fixed positioning relative to each other and to the main magnet coils 16, for accurate imaging.

It should be understood that the MRI apparatus is basically symmetrical above and below the center line 20. Also the depth of the opening 12 extends to the left of the approximately central partition line 32, so that the full length of a patient 34 may be accommodated in the MRI apparatus 14, as is conventional in the art.

Generally, there are three sets of gradient coils in the gradient field coil assembly 28, but there may be applications where only one or two gradient fields are energized. The inner electrical and magnetic construction of the gradient field assembly 28 may not be novel. Nevertheless, the gradient field coil assembly 28 may include a gradient field main coil 36, a gradient shield coil 38, and gradient coupling rings 40 that space the gradient shield coil 38 from the gradient field main coil 36. Use of discrete and properly placed gradient coupling rings 40 rather than a conventional continuous composite cylinder of, e.g. glass/epoxy material substantially reduces the cost of the gradient fields coil assembly 28 without compromising magnetic characteristics. Noise characteristics are enhanced when the rings 40 isolate the space(s) 41 from the ambient. The coupling rings 40 may also be of a metallic non-magnetic material.

Where the opening 12 is cylindrical, the coupling rings 30, 40 are continuous cylindrical hoops. Thereby, the spaces 32, 41 are isolated one from the other and are closed off axially from the ambient environment. Thus, propagation of noise generated between the gradient coil assembly 28 and the cryostat vessel 22 and within the gradient coil assembly is restricted in propagating to the external ambient.

Conventionally, a cooling tube 42 operates on the gradient field main coil 36 and is separated from the patient by an inside cover 44 that provides an attractive appearance surface to the patient as well as isolation from the cold surfaces of the cooling tube.

Flexing of the gradient field coil assembly as illustrated in FIG. 1 due to cycling of the coil assembly 28 is substantially reduced by the stiffening provided by the coupling rings 30 at central and end locations where high deflections would be expected.

In a construction where the opening 12 is elliptical in cross section shape and the magnetic coils are similarly shaped, elliptical coupling rings 30 would provide continuous support between the gradient coils and the cryostat vessel 22, and provide chambers 32 associated with the gradient coil assembly 28 that are axially separated and isolated one from the other.

Similarly, if the main magnets are flat plates. (FIG. 2c), the gradient field coil assemblies 28 are similarly shaped as plates. The spacers (couplers), are straight rather than curved and separate the static field magnet element 16 from the gradient field magnet assembly 28. In so doing, the spacers create completely enclosed spaces between the two assemblies such that the benefits of the present invention are achieved in every configuration.

In alternative embodiments in accordance with the invention, there may be coupling rings 30 only at the longitudinal ends of the gradient field coil assembly 28. Where coupling rings 30 are positioned between the axial ends of the coil assembly 28, the number of such coupling rings and their axial spacing are not limited, and the spacing need not be uniform between coupling rings 30. Additionally, at the axial ends of the coil assembly.28, the coupling rings 30 need not be flush with the coils as illustrated in FIG. 3. The end coupling rings may extend, for example, beyond the gradient and shield coils 36, 38 or may be recessed relative to the gradient shield coils 38 and gradient main coil 36.

These spaces 32 may be useful in the MRI apparatus 14, for example, in shimming the magnets as is known in the art. However, where such spaces 32 are not required the construction of a quiet gradient coil assembly and support structure in accordance with the invention, as illustrated in FIG. 4, eliminates the space between the gradient assembly 28 and the cryostat vessel 22 by shrink fitting the cryostat assembly 22 to the gradient coil assembly 28. Constructions in FIGS. 3 and 4 are similar except that the shrink fit connection of FIG. 4 replaces the couplings 30 FIG. 3.

This shrink fit may be accomplished by heating the vessel 22 along the intended interface surface 46 so that the opening 12 enlarges. Then the gradient field coil assembly 28 is inserted in the opening and the combination is allowed to cool down to room temperature. The coil assembly 28 may also be cooled during the process. A thin, e.g. 1 to 5 mil, adhesive layer e.g. epoxy, may be used to fill irregularities in the opposed mating surfaces 46 during the process of joining and subsequently rigidizes to form a permanent connection.

The process of shrink fitting differs from the traditional method of assembling MRI systems where the gradient coil assembly and the MRI static field magnet are treated as separate entities, in some cases shipped separately to a hospital site, and then assembled there.

In the embodiments with coupling rings 30, the coupling rings can be collapsible, that is, constructed of several pieces, so that the rings 30 may be disassembled when it is desirable to remove the gradient coils 28 from the MRI apparatus 14.

In another alternative embodiment (FIG. 5) in accordance with the invention, coupling rings 48 at an axial end of the gradient field coil assembly 28 include a pumpout port 50 so that the internal spaces 32, 41 may be evacuated using a vacuum system (not shown). The vacuum reduces noise propagation within the gradient coil assembly 28 and spaces 32.

Where intermediate coupling rings 30, 40 are used (as in FIG. 3) together with the end coupling rings 48 that include the vacuum ports 50, each internal space 32, 41 may be provided with a separate vacuum port whereby vacuum pump out of many spaces may be effected. Alternatively, the internal coupling rings 30, 40 may each include a fine opening 52 that allows the pressure to equalize between all chambers within the gradient coil assembly 28 and yet allows little axial noise transmission within the gradient coil assembly.

In other alternative embodiments in accordance with the invention, spaces 32, 41 within and adjacent to the gradient coil assembly 28 are filled with noise absorbent matter, for example, instead of using the vacuum.

Figure 6:
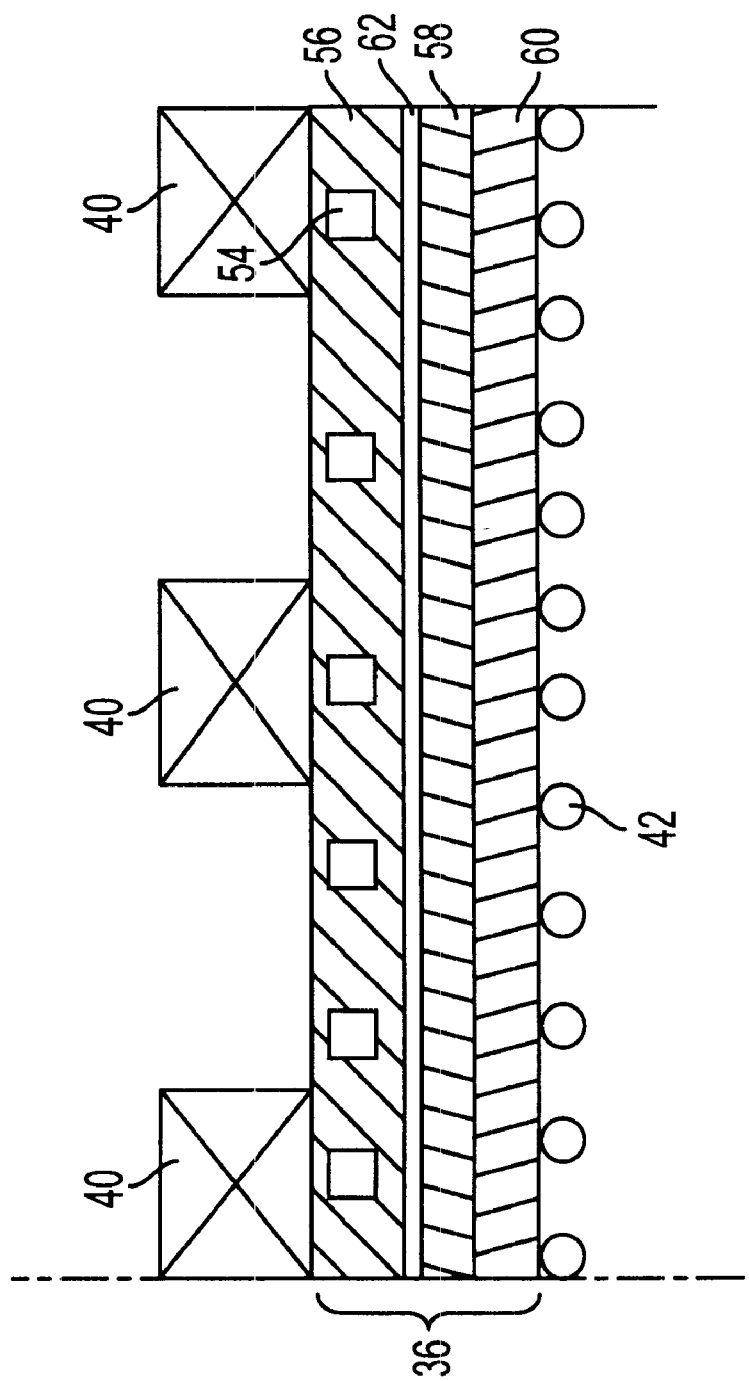
FIG. 6 is a cross section of a gradient field main coil.

FIG. 6 illustrates a typical construction of a gradient field main coil 36 (a component in a gradient fields coil assembly 28) which includes a Z axis coil 54 embedded in a glass epoxy structure 56. Adjacent to the Z axis coil 54 is the Y axis coil 58, which in turn is adjacent to the X axis coil 60. The cooling tube 42 circulates liquefied refrigerant or a gaseous coolant, for example, air. The space 62 between the structure 56 and the Y axis coil 58 is filled with a thin composite layer, for example, glass-epoxy, that hardens in place to rigidize the assembly.

An object of the present invention, that of reducing the noise generated by the gradient field coils assembly 28, is achieved by stiffening the gradient coil assembly by direct attachment to the cryostat containing the main static field magnet at the axial ends and on the entire circumferential area. The coupling rings 30, 40 that accomplish this rigidizing attachment may be viewed as simple straight bars that have been rolled into a circular or elliptical shape for the embodiments of FIGS. 2a and 2b.

Figure 7:
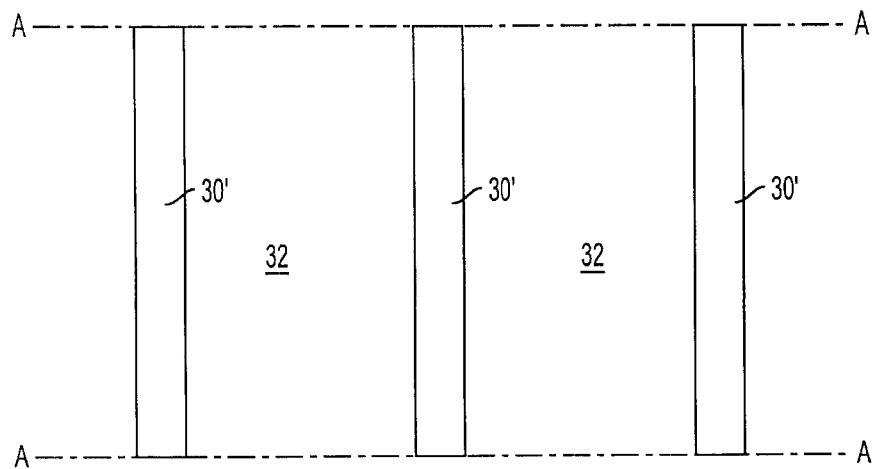
FIG. 7 illustrates an arrangement of coupling rings in accordance with the invention.

This coupling ring concept is illustrated in FIG. 7, where the three coupling rings 30 of FIG. 3 are shown, for the sake of discussion, as three unrolled (starting at imaginary seam A—A) flat bars 30. In order to effect further stiffening, sound reduction, and alteration in the frequency range of the produced sounds, other arrangements of rings may be provided for coupling between the gradient field coil assembly 28 and the outer cryostat element 22.

Figure 8:
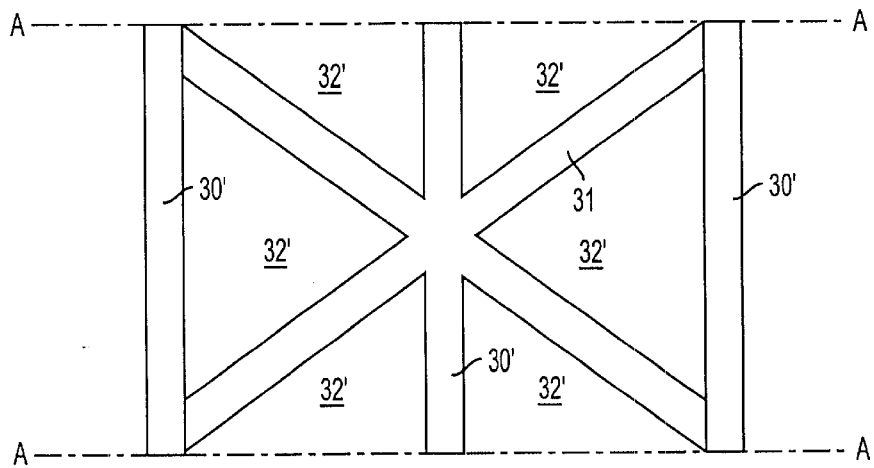
FIG. 8 illustrates another arrangement with coupling rings in accordance with the invention.

FIG. 8 illustrates (in unrolled format as in FIG. 7) a pattern for the coupling that comprises three coupling rings 30' at the axial ends and center of a gradient fields coil assembly 28, connected together by a crossed X web 31. When these members are "rolled up" for use in cylindrical or elliptical MRI apparatuses, the result is increased direct contact surface between the outer cryostat surface and the gradient field coil assembly. Then a larger plurality of closed chambers 32' exists between the coupled elements to further reduce noise propagation.

Figure 9:
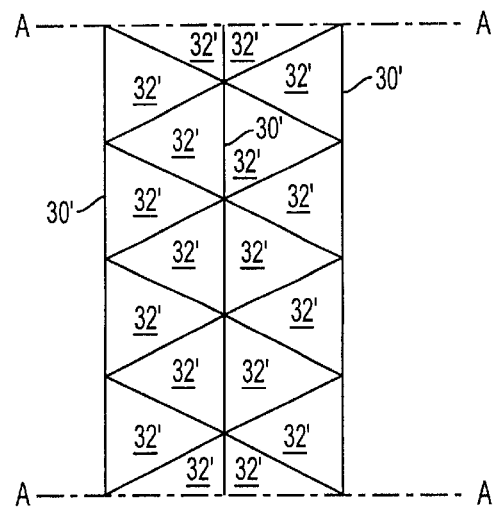
FIG. 9 illustrates still another arrangement with coupling rings in accordance with the invention.

The patterns comprising straight (circumferential) and diagonal coupling members, may be repeated more than once, with reduced dimensions between intersections, both in the circumferential and longitudinal directions so as to produce any desired waffle/egg-crate pattern of inner chambers 32'. (FIG. 9 schematically) The axially isolated chambers 32' may be filled with sound absorbent material or evacuated as discussed above. Every chamber and subchamber may not require the same treatment to effectively control noise output.

The surfaces of the coupling members and web elements that face into the chambers may be treated, for example, roughened, coated, perforated, irregularly shaped, resilient, etc., so as to interfere with sound waves within the chambers 32' and attenuate the noise escaping to the external ambient environment.

Figure 10:
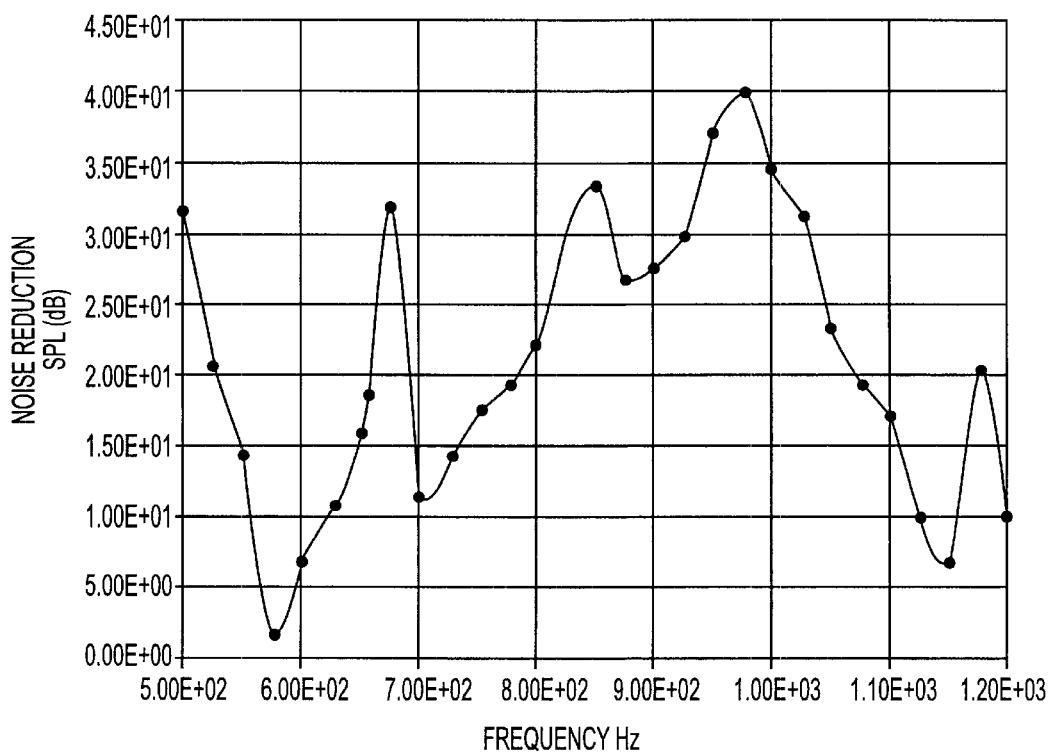
FIG. 10 is a graph of calculated noise reduction for an MRI assembly constructed in accordance with the invention.

FIG. 10 illustrates a calculated noise reduction (Sound Pressure Level in decibels) over a frequency range of 500 Hz to 1200 Hz when a Z gradient coil in accordance with the invention is assumed to be excited by a sinusoidal waveform (600 amperes peak to peak) at 500 Hz to 1200 Hz at 25 Hz intervals in a 1.5 Tesla static field.

It should be understood that a MRI magnet as used with this invention is not limited to a superconductive device maintained in a cryostat. MRI apparatuses using conventional electromagnets or permanent magnets may also be constructed for quieter operation by incorporation of the mechanical features and acoustic concepts described above.

It will thus be seen that the objects set forth above, among those made apparent from the preceding description, are efficiently attained, and since certain changes may be made in the above constructions without departing from the spirit and scope of the invention, it is intended that all matter contained in the above description and shown in the accompanying drawings shall be interpreted as illustrative and not in a limited sense.

It is also to be understood that the following claims are intended to cover all of the generic and specific features of the invention herein described, and all statements of the scope of the invention, which might be said to fall therebetween.

What is claimed is:

1. A MR apparatus for imaging a test subject located in an imaging region within the patient opening of the MR apparatus, comprising:

a main magnet having a longitudinal axis, said main magnet generating a static magnetic field in said imaging region in operation of said MR apparatus;

a rigid structure fixedly supporting said main magnet relative to said imaging region, said structure being between said main magnet and said imaging region;

a gradient field coil assembly for intermittently providing field gradients in said static magnetic field in at least one of an X, Y, and Z direction, said gradient field coil assembly having a first ed and a second end spaced apart along said axis, said gradient field coil assembly being between said main magnet and said imaging region, and being rigidly connected to said rigid structure at least proximate said first end and said second end and the center between said first and second ends, any space existing between said rigid structure and said gradient field coil assembly being substantially closed off from said imaging region by said connections proximate said center and ends, noise generated in operation of said MR apparatus being attenuated by said connections at least in directions of said axis.

2. A MR apparatus as in claim 1, wherein said rigid connections provide a plurality of substantially closed chambers or volumes in said space defined between said first and second gradient field coil assembly ends and between said gradient field coil assembly and said rigid structure, each said chamber being substantially unconnected to an enclosed space of each other chamber of said plurality of chambers.

3. A MR apparatus as in claim 1, wherein said rigid structure and said gradient field coil assembly are rigidly connected by a pair of first coupling rings proximate said coil assembly ends, said first coupling rings spanning a distance between said gradient field coil assembly and said rigid structure and circling said axis to provide a substantially closed chamber between said gradient field coil assembly ends.

4. A MR apparatus as in claim 2, further comprising at least one rigid partition subdividing said substantially closed chambers into subchambers, said subchambers being substantially closed and isolated from each other sub-chamber, said at least one rigid partition extending between said gradient field coil assembly and said rigid structure that supports said main magnet, defining said subchambers.

5. A MR apparatus, as in claim 1, wherein said connection between said rigid structure and said GRADIENT FIELD COIL ASSEMBLY is continuous, both axially, and perpendicular to said axis with insubstantial space between them.

6. An MR apparatus as in claim 5, wherein said insubstantial space is filled with adhesive material.

7. An MR apparatus as in claim 1, wherein said rigid structure is an outer surface of a cryostat, said main magnet being cooled within said cryostat.

8. An MR apparatus as in claim 3, wherein said rigid structure is an outer surface of a cryostat, said main magnet being cooled within said cryostat.

9. An MR apparatus as in claim 4, wherein said rigid structure is an outer surface of a cryostat, said main magnet being cooled within said cryostat.

10. An MR apparatus as in claim 5, wherein said rigid structure is an outer surface of a cryostat, said main magnet being cooled within said cryostat.

11. An MR apparatus as in claim 3, wherein said first coupling rings are one of metallic material and composite material including resin and fiber.

12. An MR apparatus as in claim 2, wherein walls of said closed chambers are acoustically treated.

13. An MR apparatus as in claim 12, wherein said acoustic treatment includes at least one of irregularly shaped, roughened, and coated surfaces.

14. An MR apparatus as in claim 2, wherein said chambers are filled with sound insulating material.

15. An MR apparatus as in claim 2, wherein at least a portion of said chambers include fittings for connecting said chambers to a source of vacuum.

16. An MR apparatus as in claim 1, wherein said gradient field coil assembly in cross-section transverse to said axis is one of round, generally elliptical, and a pair of generally parallel plates spaced apart one from the other.

17. An MR apparatus as in claim 1, wherein said gradient field coil assembly includes at least one gradient coil positioned concentric with said axis, a gradient shield coil located between the at least one gradient coil and said rigid structure, and at least two second coupling rings spaced axially apart and connecting between said gradient shield coil and said at least one gradient coil, said second coupling rings entirely encircling said axis and providing a closed space between said second coupling rings, said closed space attenuating sound generated in said space in axial directions.

18. A gradient field coil assembly including at least one gradient coil positioned concentric with an axis, a gradient shield coil concentric with said axis and located outside said at least one gradient coil, and at least three coupling rings spaced axially apart and connecting between said gradient shield coil and said at least one gradient coil, said coupling rings entirely encircling said axis and providing a closed space between said coupling rings, sound generated in said space being attenuated by said coupling rings in axial directions.

* * * * *